United States Patent
Nagl

(10) Patent No.: US 11,286,552 B2
(45) Date of Patent: Mar. 29, 2022

(54) METHOD FOR PRODUCING A MULTI-LAYER PLAIN BEARING ELEMENT

(71) Applicant: Miba Gleitlager Austria GmbH, Laakirchen (AT)

(72) Inventor: Johann Nagl, Stadl-Paura (AT)

(73) Assignee: Miba Gleitlager Austria GmbH, Laakirchen (AT)

( * ) Notice: Subject to any disclaimer, the term of this patent is extended or adjusted under 35 U.S.C. 154(b) by 290 days.

(21) Appl. No.: 16/476,370

(22) PCT Filed: Jan. 23, 2018

(86) PCT No.: PCT/AT2018/060020
§ 371 (c)(1),
(2) Date: Jul. 8, 2019

(87) PCT Pub. No.: WO2018/132859
PCT Pub. Date: Jul. 26, 2018

(65) Prior Publication Data
US 2020/0040441 A1    Feb. 6, 2020

(30) Foreign Application Priority Data
Jan. 23, 2017   (AT) .............................. A 50039/2017

(51) Int. Cl.
*C23C 14/16*   (2006.01)
*C23C 14/02*   (2006.01)
(Continued)

(52) U.S. Cl.
CPC .......... *C23C 14/165* (2013.01); *C23C 14/022* (2013.01); *C23C 14/027* (2013.01);
(Continued)

(58) Field of Classification Search
None
See application file for complete search history.

(56) References Cited

U.S. PATENT DOCUMENTS 3,708,418 A * 1/1973 Quinn ............... H01J 37/32009
204/298.37
4,595,483 A    6/1986 Mahler
(Continued)

FOREIGN PATENT DOCUMENTS

| CA | 1318904 C | 6/1993 |
| CN | 101 798 679 A | 8/2010 |

(Continued)

OTHER PUBLICATIONS

International Search Report in PCT/AT2018/060020, dated Jun. 12, 2018.

*Primary Examiner* — Jason Berman
(74) *Attorney, Agent, or Firm* — Collard & Roe, P.C.

(57) ABSTRACT

The invention relates to a method for producing a multi-layer sliding bearing element (1), according to which, in a chamber of a cathode sputtering installation a metal layer is deposited on a substrate by means of cathode sputtering of at least one target, said method comprising the steps: introducing a substrate into the chamber of the cathode sputtering installation; ion etching of the surface of the substrate to be coated by ion bombardment, whereby substrate particles are removed from the surface of the substrate; depositing the metal layer on the substrate, whereto target particles are produced from at least one target that is connected as the cathode, said particles being settled on the substrate. In the step of ion etching of the substrate, the target is connected as the anode and at least some of the substrate particles are deposited on the target. The polarity of the target is then reversed for the deposition of the metal layer on the surface of the substrate.

5 Claims, 1 Drawing Sheet

Figure 1:
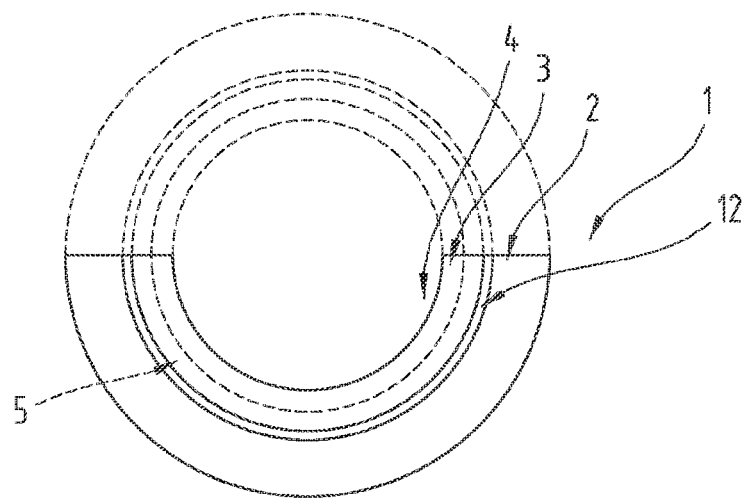

(51) Int. Cl.
    *C23C 14/34*     (2006.01)
    *F16C 33/12*     (2006.01)

(52) U.S. Cl.
    CPC ........ *C23C 14/3414* (2013.01); *F16C 33/125* (2013.01); *F16C 2223/60* (2013.01); *F16C 2240/60* (2013.01)

(56) References Cited

U.S. PATENT DOCUMENTS

| | | |
|---|---|---|
| 4,916,026 A | 4/1990 | Bergmann et al. |
| 7,862,902 B2 | 1/2011 | Zidar |
| 2006/0222772 A1* | 10/2006 | Feng ............... C23C 16/26 427/249.7 |
| 2008/0102307 A1 | 5/2008 | Zidar |
| 2008/0190760 A1* | 8/2008 | Tang ............... C23C 14/584 204/192.17 |
| 2012/0251023 A1 | 10/2012 | Gaertner |
| 2015/0291904 A1 | 10/2015 | Yasui et al. |

FOREIGN PATENT DOCUMENTS

| | | |
|---|---|---|
| CN | 102712990 A | 10/2012 |
| DE | 34 04 880 A1 | 8/1985 |
| DE | 36 29 451 A1 | 1/1988 |
| DE | 40 27 362 A1 | 4/1991 |
| DE | 10 2007 026 832 A1 | 12/2007 |
| DE | 11 2013 000 605 T5 | 10/2014 |
| GB | 2 154 249 B | 5/1988 |
| GB | 2 238 089 A | 5/1991 |
| JP | 2007-157972 A | 6/2007 |
| WO | 2011/054019 A1 | 5/2011 |

\* cited by examiner

METHOD FOR PRODUCING A MULTI-LAYER PLAIN BEARING ELEMENT

CROSS REFERENCE TO RELATED APPLICATIONS

This application is the National Stage of PCT/AT2018/060020 filed on Jan. 23, 2018, which claims priority under 35 U.S.C. § 119 of Austrian Application No. A 50039/2017 filed on Jan. 23, 2017, the disclosure of which is incorporated by reference. The international application under PCT article 21(2) was not published in English.

The invention relates to a method for producing a multi-layer sliding bearing element, according to which, in a chamber of a cathode sputtering installation a metal layer is deposited on a substrate by means of cathode sputtering of at least one target, said method comprising the steps:
  introducing a substrate into the chamber of the cathode sputtering installation;
  ion etching of the surface of the substrate to be coated by ion bombardment, whereby substrate particles are removed from the surface of the substrate;
  depositing the metal layer on the substrate, whereto target particles are produced from at least one target that is connected as the cathode, said particles being settled on the substrate.

The invention further relates to a multi-layer sliding bearing element comprising a support layer and a metal layer arranged thereon, wherein the metal layer is produced according to a cathode sputtering method.

The use of cathode sputtering methods in sliding bearing technology is already known from the prior art, for example from DE 36 29 451 A1. Depending on the material, in particular if materials that are difficult to be mixed are used for the substrate and the layer to be deposited, the adherence of the deposited layer on the substrate can be insufficient.

To face this problem, DE 40 27 362 A1 describes a method for producing a sliding bearing having an excellent bonding between a sliding bearing alloy layer and a surface layer thereof and comprising the following method steps:
  removing at least a part of both the oxide film and the modified surface layer, which is present on the sliding bearing alloy layer, in a vacuum by means of ion bombardment by argon gas;
  then, heating the sliding bearing alloy layer into an activated state; and
  formation of a thin film of a surface alloy and/or a surface alloy layer having a thickness of 3 to 60 μm on the sliding bearing alloy layer by means of physical vapor deposition.

For cleaning the substrate to be coated, it is connected as the cathode in a first step and a potential of 500 volts is applied between this cathode and an additional anode. Hence, the positively charged argon ions are caused to collide against the substrate, whereby the surface oxide film and the modified surface layer on the substrate were removed. Then, the coating chamber is again evacuated in order to be cleaned. Then, argon gas is re-introduced into the vacuum chamber. From a separate target, which is connected as the cathode for coating of the substrate, via a glow discharge between the anode and this target, and the bombardment of the target with argon ions effected thereby, particles are generated due to the bombarding energy and these are deposited on the substrate. The evaporation of the target is effected after heating of the substrate only, such that the energy of reaction between the bearing alloy and the surface layer is increased and thereby the alloy formation and/or alloying thereof is accelerated. Consequently, a higher level of adhesion and/or bonding strength is obtained, and additionally the bonding between the particles of the surface layer alloy is increased, whereby a strongly adhering surface layer is produced.

It was the object of the present invention to provide a multi-layer sliding bearing element with a high adherence of a metal layer settled onto a support layer by means of a cathode sputtering method.

The object is achieved by means of the initially mentioned method, according to which it is provided for that in the step of ion etching of the substrate, the target is connected as the anode and at least some of the substrate particles are deposited on the target and the polarity of the target is then reversed for the deposition of the metal layer on the surface of the substrate.

The object of the invention is further achieved with the initially mentioned multi-layer sliding bearing element, in which a transitional zone is formed between the metal layer and the support layer, with both a share of the material of the support layer and a share of the material of the metal layer being contained in said transitional zone, wherein within the transitional zone the share of the material of the metal layer increases starting out from the surface of the support layer.

By substrate particles being deposited on the target during ion etching, a mixture of substrate particles and target particles is already achieved on the target, which can then be deposited on the substrate together. Depending on the amount of substrate particles deposited on the target, a layer merely consisting of substrate particles can also be present on the target. Consequently, the target is sputtered and the target particles are settled on the substrate. The target particles now also comprise the previously deposited substrate particles, such that a mixture of the two types of particles is settled. This, in turn, improves the adherence of the metal layer on the substrate, as the transition of substrate to metal layer is not abrupt. As an additional effect, by means of this method a more efficient production of the multi-layer sliding bearing element can be realized, as cleaning of the coating chamber from particles originating from the substrate, as carried out in the aforementioned prior art, is not obligatorily required any more.

According to an embodiment variant of the method, it can be provided for that the method step of depositing the metal layer on the substrate is carried out immediately subsequent to the step of ion etching of the surface of the substrate. Hence, a simplification of the method and thus a saving of time in producing the multi-layer sliding bearing element can be realized, as intermediate flushing of the coating chamber can be dispensed with. A spatial separation between the chamber for precleaning and the process chamber is not required.

According to a further embodiment variant of the method, it can be provided for that by means of the ion etching of the surface of the substrate, substrate particles up to a layer thickness of at least in some areas 0.3 μm to 5 μm are removed therefrom. Hence, the adherence can be further improved, as during the ion etching a relatively high amount of substrate material is removed, which is then available for the subsequent deposition of the metal layer, whereby the layer thickness of the transitional zone is broadened and thus the transition of the material of the transitional zone to the metal layer can be designed more softly. Thus, a stronger mechanical clinging of the components and hence a strengthening of the bonding of the metal layer on the substrate can be achieved.

Preferably, not just a mixture of substrate particles and target particles are settled on the substrate but during the deposition of the metal layer on the substrate, alloy particles are formed at least from some of the substrate particles and some of the target particles. A further improvement of the adherence of the metal layer on the substrate can also be achieved with this embodiment variant.

The surface of the substrate to be coated can also be cleaned simultaneously with the ion etching, for example from oxides, i.e. non-metallic particles. A shortening of the method can, in turn, be achieved thereby. The non-metallic particles can also be settled on the at least one target in this method step, such that during the deposition of the metal layer these are at least partially transferred back to the substrate.

According to an embodiment variant of the multi-layer sliding bearing element, non-metallic particles that are also present on surfaces of the support layer not provided with the metal layer are contained in the transitional zone. Surprisingly, these particles do not interfere with the coating process and the adherence of the metal layer on the substrate. This is assumedly due to the fact that these non-metallic particles which were concentrated on the relatively thin surface layer on the substrate are distributed onto a larger volume and/or a larger layer thickness during the deposition of the metal layer. This embodiment variant not only avoids the intermediate flushing of the coating chamber for removing oxidic components, but these non-metallic particles, for example ceramic particles, can potentially also have an amplifying effect in the transitional zone.

It can also be provided for that the transitional zone has a layer thickness of between 0.3 µm and 5 µm, whereby, in turn, a more or less soft transition from the substrate to the metal layer can be achieved.

For the purpose of better understanding of the invention, it will be elucidated in more detail by means of the figures below.

Figure 2:
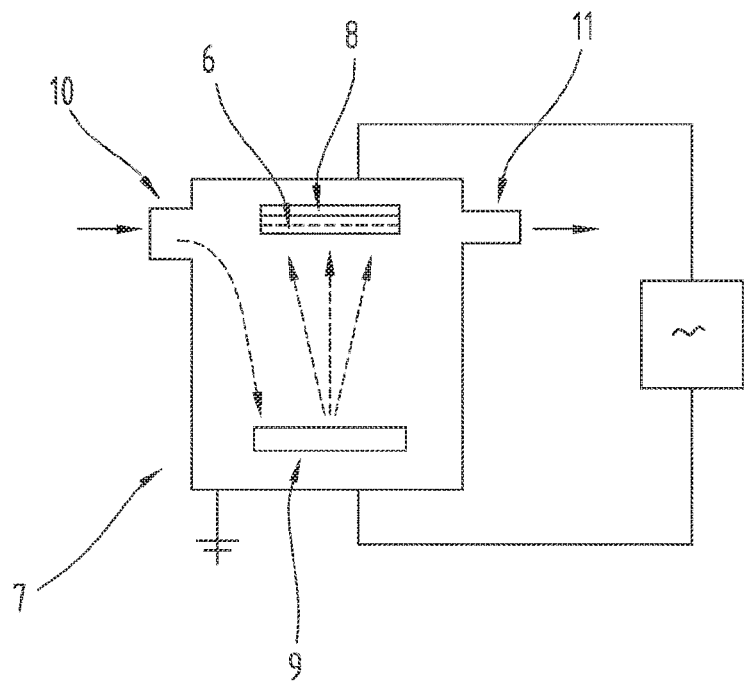

These respectively show in a simplified schematic representation:

FIG. 1 a side view of a multi-layer sliding bearing element;

FIG. 2 a sputtering chamber.

First of all, it is to be noted that in the different embodiments described, equal parts are provided with equal reference numbers and/or equal component designations, where the disclosures contained in the entire description may be analogously transferred to equal parts with equal reference numbers and/or equal component designations. Moreover, the specifications of location, such as at the top, at the bottom, at the side, chosen in the description refer to the directly described and depicted figure and in case of a change of position, are to be analogously transferred to the new position.

Where hereinafter and/or in general alloy compositions are indicated, these are—if not indicated otherwise—to be understood such that the shares are respectively indicated in wt. %.

Indications of numbers regarding the compositions of alloys always refer to the complete alloy if not indicated otherwise.

The indications regarding the alloy compositions further are to be understood such that these include usual impurities as occur in raw material used on an industrial scale. However, in the context of the invention, there is the possibility that pure metals and/or purest metals are used.

FIG. 1 shows a multi-layer sliding bearing element 1 in the form of a sliding bearing half shell. What is shown is a two-layer variant of the multi-layer sliding bearing element 1 consisting of a support layer 2 and a sliding layer 3, which is arranged on a front side 4 (radially inner side), that can be faced towards a component to be borne, of the multi-layer sliding bearing element 1.

Where applicable, a bearing metal layer 5 can be arranged between the sliding layer 3 and the support layer 2, as is adumbrated in dashed lines in FIG. 1.

The basic construction of such multi-layer sliding bearing elements 1, as are for example used in internal combustion engines, is known from the prior art, such that further explanations in this regard can be dispensed with. However, it should be noted that further layers can be arranged, i.e. that for example a bonding layer and/or a diffusion barrier layer can be arranged between the sliding layer 4 and the bearing metal layer 5; likewise, a bonding layer can be arranged between the bearing metal layer 3 and the support layer 2.

Within the scope of the invention, the multi-layer sliding bearing element 1 can also be designed differently, for example as a bearing bush, as is adumbrated in dashed lines in FIG. 1. Likewise, designs such as thrust rings, axially extending sliding shows or the like are possible.

The support layer 2 preferably consists of steel, however, can also consist of a material providing the multi-layer sliding bearing element 1 with the required structural strength. Such materials are known from the prior art.

The alloys and/or materials known from the relevant prior art can be used for the bearing metal layer 5 as well as for the intermediate layers, and corresponding reference is made thereto in this regard.

The sliding layer 3 can consist of an alloy with an element from the group comprising and/or consisting of tin, aluminum, copper, silver, carbon, molybdenum, indium as a base element forming the main component of the alloy. However, it can also be provided for that the sliding layer 3 merely consists of one element, such as silver, tin, carbon, indium. Particularly preferred, the sliding layer 3 and/or in general the metal layer is/are manufactured from silver only or from a and/or as a silver-base alloy.

A sliding bearing element blank 6 is prepared for producing the multi-layer sliding bearing element 1. The sliding bearing element blank 6 consists of at least the support layer 2, however, it can also comprise at least one further of the aforementioned layers, in particular the bearing metal layer 5. This sliding bearing element blank 6 (FIG. 2) can be produced in accordance with the prior art, for example by means of a bearing metal layer being applied onto a steel plate and being connected thereto by means of rolling. Other known methods can also be applied. If applicable, a mechanical processing of this sliding bearing element blank 6 is carried out.

However, it should explicitly again be noted that the multi-layer sliding bearing element 1 can also consist of the support layer 2 and the sliding layer 3 only.

The sliding bearing element blank 6 can already be brought into the corresponding form, for example into the form of a half shell, by forming before the sliding layer 3 is deposited thereon.

The sliding layer 3 is deposited on the sliding bearing element blank 6 from the gaseous phase according to a cathode sputtering method. As this method is generally known from the prior art, reference be made thereto for the avoidance of repetitions.

At this point, it is to be noted that in the scope of the invention, it is possible that other layers of the multi-layer sliding bearing element 1 are also deposited on the sliding bearing element blank 6 by vapor deposition according to a cathode sputtering method, for example the bearing metal layer 5.

For the deposition, at least one sliding bearing element blank 6 is placed in a deposition chamber 7, which is schematically depicted in FIG. 2. For example, the sliding bearing element blank 6 can be locked into the deposition chamber 7 via a lock. The sliding bearing element blank 6 can be arranged on a carrier 8, and be held thereby, during the deposition of the sliding layer 3.

The single- or multi-layer sliding bearing element blank 6 constitutes the substrate for the subsequent deposition of the metal layer.

It is also possible that several sliding bearing element blanks 6 are coated simultaneously, which a correspondingly shaped carrier 8 can be used for.

Where reference is made to a sliding bearing element blank 6 below, these statements also apply to the simultaneous coating of several sliding bearing element blanks 6, also where this is not explicitly mentioned.

Although the sliding bearing element blank 6 is depicted being planar in FIG. 2, —as was described above—it can also be formed already, i.e. for example comprise the shape of a half shell, such that the sliding bearing element blank 6 to be coated can comprise a curved surface to be coated.

In this case, it can preferably be provided for that the target 9 is arranged coaxially with this half shell for the deposition of the metal layer, in particular the sliding layer 3.

The sliding layer 3 can preferably be generated with a layer thickness of at least 5 μm, preferably at least 15 μm, and of at most 60 μm, preferably at most 50 μm, if a bearing metal layer 3 is arranged. In absence of a bearing metal layer 3, preferably, layer thicknesses of at least 20 μm, preferably at least 50 μm, and at most 500 μm, preferably at most 200 μm are generated.

At least one target 9 is arranged in the deposition chamber 7. However, several targets 9 can also be arranged.

The target 9 preferably comprises the same metals from which the sliding layer 3 to be deposited is manufactured, for example the aforementioned elements of the mentioned base alloys. In particular, the target 9 contains these metals in the same relative quantities to one another, such that the target 9 can thus at least approximately comprise the same, in particular the exact same, composition, as the sliding layer 3 to be produced.

If several targets 9 are used, these can all have the same composition. However, it is also possible to use differently composed targets 9, while the sum of the targets 9 qualitatively yields the sum of the metals to be deposited.

The target(s) 9 and the sliding bearing element blank(s) 6 are correspondingly electrically contacted, such that an electric potential prevails between these.

If required, the deposition chamber 7 is flushed and evacuated after the sliding bearing element blank 6 was placed therein for the deposition. This can for example be the case if the sliding bearing element blank 6 is not locked in but the deposition chamber 7 is opened for this purpose.

The process gas used during the deposition of the metal layer on the sliding bearing element blank 6, for example argon, can also be used as flushing gas. The pressure for the subsequent treatment of the sliding bearing element blank 6 can amount to between $5 \cdot e^{-3}$ mbar and 0.1 mbar.

Prior to the deposition of the actual metal layer on the sliding bearing element blank 6, i.e. the sliding layer 3 in the exemplary embodiment observed here, it is subjected to a pretreatment. For this purpose, the sliding bearing element blank 6 is connected as the cathode and the at least one target 9 as the anode. By means of the bombardment of the surface of the sliding bearing element blank 6 to be coated with ions from the (inert) gas in the deposition chamber 7, a part of the sliding bearing element blank 6 in the form of substrate particles is removed therefrom. These then move towards the anode, i.e. to the target 9, and settle on the surface thereof at least partially, in particular completely.

For this ion etching, the following parameters can be applied:

Difference of potential between the sliding bearing element blank 6 and the target 9 or the targets 9: −1700 V to −400 V Process gas: argon Process gas pressure: $5 \cdot e^{-3}$ mbar to 0.1 mbar Temperature: 90° C. to 190° C.

Duration of treatment: 2 minutes to 60 minutes

Preferably, the ion etching of the surface of the substrate, i.e. of the sliding bearing element blank 6, according to an embodiment variant of the method, can be carried out until substrate particles up to a layer thickness of at least in some areas 0.3 μm to 5 μm, in particular 0.5 μm to 1.5 μm are removed therefrom. In other words, the layer thickness of the sliding bearing element blank 6 starting out from the surface to be coated is at least in some areas, in particular entirely, reduced by 0.3 μm to 5 μm, in particular by 0.5 μm to 1.5 μm.

According to a further embodiment variant, it can be provided for that not only metal components of the sliding bearing element blank 6 are removed, but that simultaneously impurities adhering thereto, in particular in the form of ceramic particles, such as oxides, are also removed. A separate cleaning of the sliding bearing element blank 6 from these overlays can thus be dispensed with. These ceramic particles can also be at least partially settled on the surface of the target 9, such that in further consequence these return to the sliding bearing element blank 6 during the actual coating step. In this embodiment variant, the term substrate particles also comprises particles originating from impurities.

According to an embodiment variant in this regard, it can be provided for that the removed particles are oxidized by means of a process gas mixture (for example an argon/oxygen mixture) during cleaning of the substrate (during ion etching), and that these are then settled on the target 9. Hence, ceramic particles, for example oxides, can be generated to a larger extent, for example for strengthening the metal layer.

Alternatively or additionally to this, particles can be reactively sputtered in the coating process by means of a gas mixture, whereby ceramic particles can also be generated.

The incorporation of ceramic particles can also be used for forming an electrically insulating layer in the multi-layer sliding bearing element 1. For this purpose, for example at the beginning of the deposition of the metal layer on the sliding bearing element blank 6, a process gas mixture, for example argon with oxygen, can be used, such that the particles to be deposited are oxidized. After obtainment of the desired layer thickness, a change to pure inert gas for the further course of the deposition can be carried out. At this, remainders of the previously present additional gas are used up. This approach can generally be applied for incorporating ceramic particles, i.e. not only for the formation of an electrically insulating layer.

After this pretreatment of the sliding bearing element blank 6, the deposition chamber 7 can be cleaned if required, i.e. in particular be flushed with an inert gas one or several times and be evacuated for the deposition of the sliding layer 3.

In the preferred embodiment variant of the method, the deposition of the metal layer on the substrate, i.e. in this example of the sliding layer 3 on the sliding bearing element blank 6, is carried out immediately subsequent to the ion etching in the same deposition chamber 7.

The deposition of the metal layer, i.e. in particular of the sliding layer 3, is carried out in a process gas, for example consisting of or comprising argon. For the deposition, the polarities of the sliding bearing element blank 6 and the target 9 are reversed, such that during the deposition of the metal layer on the sliding bearing element blank 6 the latter constitutes the anode and the target constitutes the cathode.

Merely for the sake of completeness, it should be noted that for introducing the process gas, the deposition chamber 7 can comprise at least one inlet 10 and that for the discharge thereof it can comprise at least one outlet 11.

For the deposition by means of sputtering method (cathode sputtering method), the following parameters can be applied:

Difference of potential between the sliding bearing element blank 6 and the target 9 or the targets 9: −300 V to 850 V Process gas (mixture): argon, (oxygen)
Process gas pressure: $2 \times e^{-3}$ mbar to 0.1 mbar,
Temperature: 80° C. to 240° C.
Coating rate: 0.1 µm/minute to 5 µm/minute
Duration of coating: 5 minutes to 380 minutes As is known, in sputtering, process gas ions are accelerated onto the target 9 and knock the metal atoms (i.e. the target particles) to be deposited out of it, which in further consequence are accelerated towards the sliding bearing element blank 6 and settle on its surface, such that the sliding layer 3 is built up.

Thus, with the cathode sputtering method, the metal layer, in particular the sliding layer 3, can be deposited on the sliding bearing element blank 6 from the gaseous phase in a process gas. For this purpose, the metal layer is produced from a target 9, which comprises a metal combination with a metal base element or consists thereof (referring to the metal combination), by at least partial sputtering of the target 9 and subsequent settling of the sputtered target particles on the sliding bearing element blank 6.

After substrate particles were settled on the target 9 during the pretreatment, during the at least partial sputtering of the target 9 these are also again sputtered and hence at least partially return to the surface of the sliding bearing element blank 6 to be coated. Depending on for how long the pretreatment was carried out, at the beginning of the deposition of the metal layer on the sliding bearing element blank 6, either only these substrate particles are settled on the sliding bearing element blank 6 or already a mixture of the substrate particles and the target particles. With increasing duration of the deposition of the metal layer, the share of substrate particles in the mixture of substrate and target particles decreases until the substrate particles have been entirely used up and in consequence only the target particles further settle on the sliding bearing element blank 6 for forming the metal layer.

This way, a transitional zone 12 (FIG. 1) emerges between the substrate, i.e. the sliding bearing element blank 6 and the metal layer, i.e. for example the sliding layer 3, with both the material of the substrate and the material of the metal layer being contained in said transitional zone 12.

According to a preferred embodiment variant of the multi-layer sliding bearing element 1, the duration of the pretreatment (which is inter alia responsible for the amount of substrate particles on the target 9) is selected such that the transitional zone 12 comprises a layer thickness of between 0.3 µm and 5 µm, in particular between 0.5 µm and 3 µm. Layer thickness of the transitional zone 12 on the multi-layer sliding bearing element 1 refers to that layer thickness which is determined by means of EDX according to the following method. A radial line scan over the binding zone is carried out and the X-ray signal for substrate (A) and sliding layer material (B) is measured. The signal strengths (increase of A with simultaneous decrease of B and vice versa) follow a logistic function. The layer thickness now is the distance between two points, where the signal strength B increases from 10% to 90%.

According to another embodiment variant of the method for producing the multi-layer sliding bearing element 1, it can be provided for that during the deposition of the metal layer on the substrate, alloy particles are formed from at least a part of the substrate particles and a part of the target particles. In other words, the metal layer is thus alloyed with the material of the substrate, i.e. of the material of the multi-layer sliding bearing element 1 to be coated. Examples for this are silver with iron. However, the formation of intermetallic phases from the material of the sliding bearing element blank 6 and the metal layer is also possible, as for example $Cu_6Sn_5$, whereby the adherence of the metal layer on the sliding bearing element blank 6 can be further strengthened.

By means of this method, a multi-layer sliding bearing element 1 can be produced, which comprises a support layer 2 and a sliding layer 3 arranged thereon, wherein the sliding layer 3 is produced according to a cathode sputtering method, and a transitional zone 12 is formed between the sliding layer 3 and the support layer 2, both a share of the material of the support layer 2 and a share of the material of the sliding layer 3 being contained in said transitional zone 12, wherein within the transitional zone 12 the share of the material of the sliding layer 3 increases starting out from the surface of the support layer 2.

If cleaning of the sliding bearing element blank 6 is also carried out in the same deposition chamber 7, a multi-layer sliding bearing element 1 can be produced in which non-metallic particles are contained in the transitional zone 12, which are also present on other surfaces of the support layer 2 not provided with the sliding layer 3 as surface impurities.

After deposition of the metal layer, i.e. in particular the sliding layer 3, on the sliding bearing element blank 6, a further tribologically active layer, for example a running-in layer or a sliding lacquer layer, can be applied onto the free surface of the metal layer.

The following sliding layers 3 were produced by means of the described method. In this process, half shells consisting of a support layer 2 of steel were introduced as sliding bearing element blanks 6, wherein a sliding layer 3 with a thickness of approximately 20 µm was applied. The generation of the sliding layer 3 can be carried out both from an individual source (target 9) or from several sources (targets 9) of the same or different compositions simultaneously. Alloys in the following variations of compositions were produced as sliding layer 3.

For assessing the adherence (a) after coating and (b) after artificial aging in nitrogen atmosphere at 180° C. for 1000 h, oblique sections were produced. (1) visible detachment in % in oblique section after coating and (2) detachments after scraping test by means of a hard metal chisel were determined. The assessment of bonding is carried out according to a grading system in which 1 represents excellent bonding and 5 represents complete layer detachment.

Exemplary Embodiment 1

Blank: steel with bearing metal CuZn5Sn
Sliding layer: AlSn20Cu1
Pretreatment:
Difference of potential between the sliding bearing element blank 6 and the target 9 −1150 V
Process gas: argon
Process gas pressure: $2 \times e^{-2}$ mbar,
Temperature: 120° C.
Duration of treatment: 6 minutes
Deposition:
Difference of potential between the sliding bearing element blank and the target 620 V
Process gas: argon
Process gas pressure: $1e\ e^{-2}$ mbar,
Temperature: 130° C.
Voltage on the target(s) 9: 0 V
Coating rate: 1.19 µm/minute
Duration of coating: 21 minutes
Results:
Layer thickness of the transitional zone: 0.8 µm
Layer thickness of the sliding layer in total: 25 µm

| Bonding | | |
|---|---|---|
| | (1) detachment | (2) scraping test |
| (a) after coating | 0% | 1.0 |
| (b) after artificial aging | 0% | 1.2 |

Exemplary Embodiment 3

Blank: steel
Sliding layer: AgCu6
Pretreatment:
Difference of potential between the sliding bearing element blank 6 and the target 9 −1290 V
Process gas mixture: argon+0.5% oxygen
Process gas pressure: $1e\ e^{-2}$ mbar,
Temperature: 240° C.
Duration of treatment: 20 minutes
Deposition:
Difference of potential between the sliding bearing element blank 6 and the target 9: 550 V
Process gas: argon
Process gas pressure: $10e\ e^{-2}$ mbar,
Temperature: 130° C.
Coating rate: 2.4 µm/minute
Duration of coating: 42 minutes
Results:
Layer thickness of the transitional zone: 1.7 µm
Layer thickness of the sliding layer in total: 100 µm

| Bonding | | |
|---|---|---|
| | (1) | (2) |
| (a) after coating | 0% | 1.0 |
| (b) after artificial aging | 0% | 1.0 |

Variant 3—prior art—no pretreatment, ion etching in separate process chamber:
Blank: steel with bearing metal CuZn5Sn
Sliding layer: AlSn20Cu1
Deposition:
Difference of potential between the sliding bearing element blank 6 and the target 9: 550 V
Process gas: argon
Process gas pressure: $10e\ e^{-2}$ mbar,
Temperature: 130° C.
Coating rate: 1.19 µm/minute
Duration of coating: 21 minutes
Results:
Layer thickness of the transitional zone: 1 µm—non-existent
Layer thickness of the sliding layer in total: 25 µm

| Bonding | | |
|---|---|---|
| | (1) | (2) |
| (a) after coating | 0% | 1.2 |
| (b) after artificial aging | 75% | 4.4 |

It should be noted that other alloys can also be produced as sliding layer 3, as for example SnCu9Sb4Bi1, CuAl10Fe3, Ag, AlSn20Fe1. Thus, the mentioned alloy compositions merely have an exemplary and no restrictive character.

The exemplary embodiments show and/or describe possible embodiment variants, while it should be noted at this point that combinations of the individual embodiment variants are also possible.

Finally, as a matter of form, it should be noted that for ease of understanding of the structure of the multi-layer sliding bearing element 1 and/or the cathode sputtering installation, these are not obligatorily depicted to scale.

LIST OF REFERENCE NUMBERS

1 multi-layer sliding bearing element
2 support layer
3 sliding layer
4 front side
5 bearing metal layer
6 sliding bearing element blank
7 deposition chamber
8 carrier
9 target
10 inlet
11 outlet
12 transitional zone

The invention claimed is:
1. A method for producing a multi-layer sliding bearing element (1), according to which, in a chamber of a cathode sputtering installation a metal layer is deposited on a substrate by means of cathode sputtering of at least one target, said method comprising the steps:
 introducing a substrate into the chamber of the cathode sputtering installation;
 ion etching of the surface of the substrate to be coated by ion bombardment, whereby substrate particles are removed from the surface of the substrate;
 depositing the metal layer on the substrate, whereto target particles are produced from at least one target that is connected as the cathode, said particles being settled on the substrate, wherein in the step of ion etching of the substrate, the target is connected as the anode and at least some of the substrate particles are deposited on the target so that a mixture of the substrate particles and the target particles is achieved and the polarity of the target is then reversed for the deposition of the metal layer on the surface of the substrate, wherein the mixture of the substrate particles and the target particles is deposited on the substrate together to improve adherence of the metal layer on the substrate, wherein a transitional zone is created between the substrate and the metal layer, wherein material of the substrate and material of the metal layer are contained in the transitional zone, and wherein the transitional zone comprises a layer thickness of between 0.3 µm and 5 µm.

2. The method according to claim 1, wherein the method step of depositing the metal layer on the substrate is carried out immediately subsequent to the step of ion etching of the surface of the substrate.

3. The method according to claim 1, wherein by means of the ion etching of the surface of the substrate, substrate particles up to a layer thickness of at least in some areas 0.3 µm to 5 µm are removed therefrom.

4. The method according to claim 1, wherein during the deposition of the metal layer on the substrate, alloy particles are formed from at least a part of the substrate particles and a part of the target particles.

5. The method according to claim 1, wherein the surface of the substrate to be coated is also cleaned simultaneously with the ion etching.

\* \* \* \* \*